(12) United States Patent
Tsironis

(10) Patent No.: US 11,621,468 B1
(45) Date of Patent: Apr. 4, 2023

(54) COMBINATION PROBES FOR LOAD PULL TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 17/471,837

(22) Filed: Sep. 10, 2021

(51) Int. Cl.
*H03H 7/38* (2006.01)
*H01P 5/04* (2006.01)
*G01R 31/28* (2006.01)
*G01R 27/32* (2006.01)

(52) U.S. Cl.
CPC .............. *H01P 5/04* (2013.01); *G01R 27/32* (2013.01); *G01R 31/2822* (2013.01); *H03H 7/38* (2013.01)

(58) Field of Classification Search
CPC ... H03H 7/38; H03H 7/40; H01P 5/04; G01R 27/32; G01R 31/2822; G01R 31/282; G01R 31/2601; G01R 1/26; G01R 1/24; G01R 35/005; H04L 25/0278
See application file for complete search history.

(56) References Cited

U.S. PATENT DOCUMENTS

| 6,980,064 | B1 | 12/2005 | Boulerne |
| 8,098,112 | B2 | 1/2012 | Simpson |
| 8,358,186 | B1 | 1/2013 | Tsironis |
| 9,252,738 | B1 | 2/2016 | Tsironis |
| 9,716,483 | B1 * | 7/2017 | Tsironis .................. H03H 7/40 |

OTHER PUBLICATIONS

"Load Pull" [online] Wikipedia, [Retrieved on Aug. 24, 2017]. Retrieved from Internet <URL:wikipedia.org/wiki/Load_pull>.
"Computer Controlled Microwave Tuner—CCMT", Product Note 41, Focus Microwaves Jan. 1998, pp. 2-4.

* cited by examiner

*Primary Examiner* — Stephen E. Jones

(57) ABSTRACT

Combination tuning probes for slide screw load pull tuners allow larger frequency coverage Fmax/Fmin and higher GAMMA beyond the capacity of existing tuning probes. This is done by combining two or more equally or unequally long tuning slugs into a combination probe, the slugs being mounted in the same mobile tuner carriage using two or more independent vertical axes. To avoid spurious resonance phenomena the tuning slugs are driven parallel vertically in close proximity or sliding on each-other, are linked to each-other and guided appropriately allowing smooth, un-inhibited and continuous vertical movement of the metallic bodies.

6 Claims, 11 Drawing Sheets

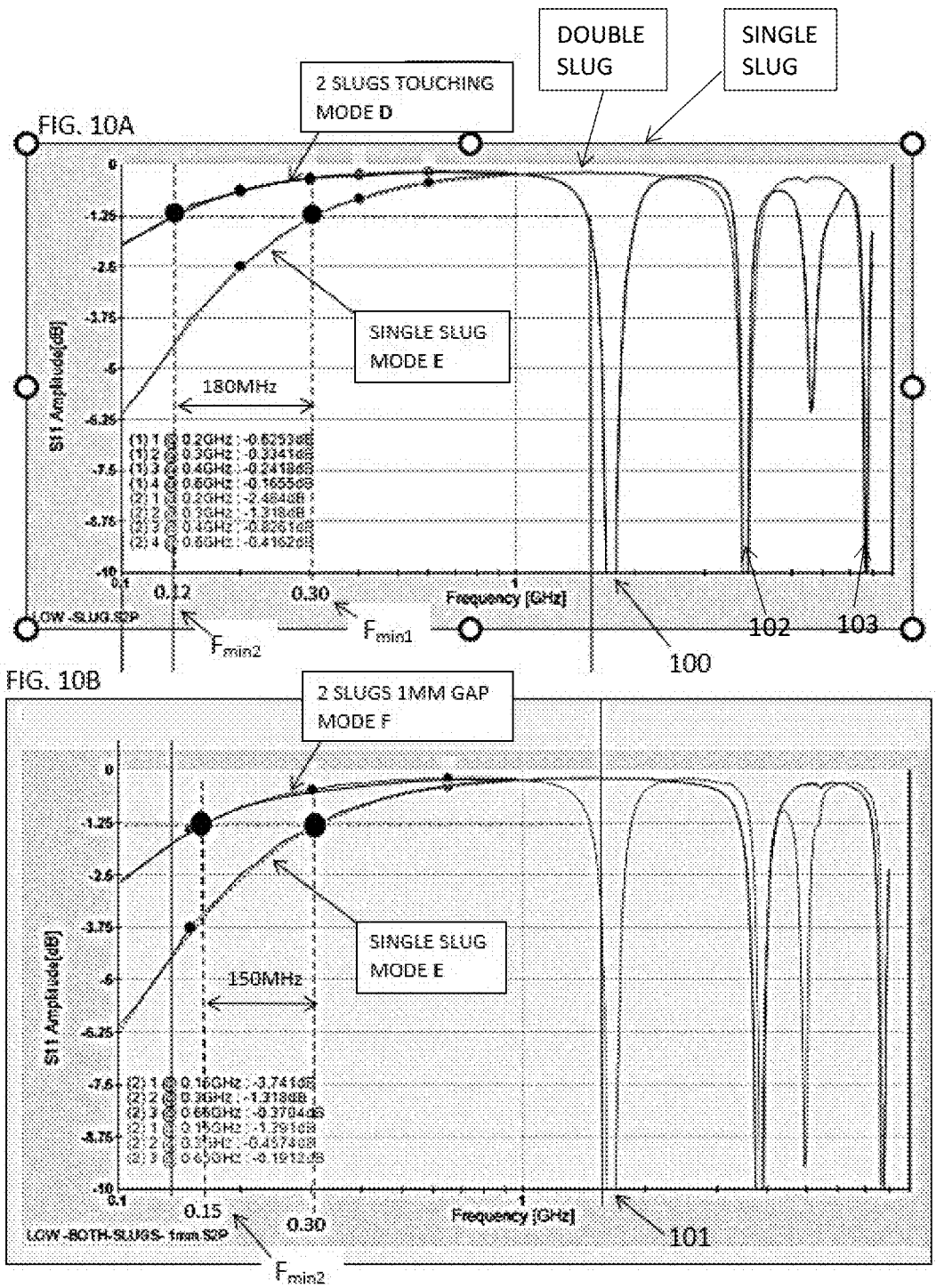

COMBINATION PROBES FOR LOAD PULL TUNER

PRIORITY CLAIM

Not Applicable

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. Tsironis, C. U.S. Pat. No. 8,358,186, "Impedance Tuners with Resonant Probes".
4. Boulerne, P. U.S. Pat. No. 6,980,064, "Slide-screw Tuner with Single Corrugated Slug".
5. Simpson, G. U.S. Pat. No. 8,098,112, "Impedance Tuner Systems and Probes".
6. Tsironis; C. U.S. Pat. No. 9,252,738, "Wideband Tuning Probes for Impedance Tuners and Method".

BACKGROUND OF THE INVENTION

This invention relates to general microwave testing and in particular to testing of microwave transistors (DUT) in the frequency domain using Load Pull (see ref. 1). Load pull is a measurement method whereby the load impedance presented to the DUT at a given frequency is changed systematically and the DUT performance is registered, with the objective to find an optimum embedding (matching) network for obtaining the design objectives, which may be maximum gain, power, efficiency, linearity or else.

PRIOR ART

The popular load pull method for testing and characterizing medium to high-power microwave and millimeter-wave transistors (DUT, device under test) is called "load-pull" and uses appropriate test setups (FIG. 1), see ref. 1. Low noise transistors are tested using "source-pull". Load or source pull use impedance tuners 2, 4 (see ref. 2) and other test equipment, such as signal or noise sources 1, test fixtures housing the DUT 3, and power meters or low noise receivers 5, the whole controlled by a computer 6; the computer controls and communicates with the tuners 2, 4 and the other equipment 1, 5 using digital cables 7, 8, 9. The tuners are used in order to manipulate the microwave impedance conditions in a systematic and controlled manner, under which the DUT is tested (see ref. 1); impedance tuners allow determining the optimum impedance conditions of embedding networks for designing amplifiers and other microwave components for specific performance targets, such as noise parameters, gain, efficiency, intermodulation etc. For devices in chip-form, tested preferably on-wafer (see ref. 5), the insertion loss between the DUT and the tuner reduces the effective reflection factor $\Gamma_{LOAD}$ at the DUT reference plane. The only method to increase the reflection factor in a passive system is increasing the reflection factor of the tuner. Since the tuning probe 34 is capacitively coupled with the center conductor 33, this means increasing the maximum controllable capacitance by increasing the surface between the probes and the center conductor, which is possible, while avoiding a short circuit, only by increasing its horizontal length 37. Various types of resonant or combination tuning probes, including one or more slugs, have been reported before (see ref. 3, 4, 5 and 6); however, none includes independent vertical movement of the individual slugs; in ref. 4 to 6 the objective has been to increase the tuning dynamic (GAMMA MAX) in certain frequency areas using statically positioned multi slug tuning probes, and in ref. 3 the objective was frequency selective tuning operation of single slug tuning probes. Dual- or three-slug combination probes, wherein the slugs are sidewise fully or quasi touching but vertically independently moving, has not been reported before.

BRIEF DESCRIPTION OF THE INVENTION

The objective of this invention is the creation of combination tuning probes for slide screw impedance tuners, which will allow larger maximum to minimum frequency coverage Fmax/Fmin and higher tuning dynamic range (maximum VSWR or GAMMA), beyond the capacity of existing tuning probes, effectuated with minimum cost and requirement for external mechanical intervention. This is done by combining two or more equally or unequally long tuning slugs into a combination probe, the slugs being mounted in the same mobile tuner carriage 41 using two or more independent vertical axes 40, 42. Here, horizontal 37 means parallel to the slotted tuner airline (slabline) 31 and vertical 36 means perpendicular to it. To avoid spurious resonance phenomena and ensure continuous frequency coverage the, equal or unequal, tuning slugs are not only driven parallel vertically in close proximity or sliding on each-other, but, to avoid any permanent or temporary uncontrollable crevices (gaps) between the slugs during the movement, which would create resonances (FIG. 7B), they should also be somehow linked to each-other 46 and guided appropriately 47. This is done using any of numerous possible mechanical arrangements (embodiments) allowing smooth, un-inhibited and continuous vertical movement of the metallic bodies.

DETAILED DESCRIPTION OF THE DRAWINGS

The invention and its mode of operation will be better understood from the following detailed description when read with the appended drawings in which:

FIG. 4A depicts the front view; FIG. 4B depicts a cross section X-Y and FIG. 4C depicts a vertical cross section of a tuning probe penetrating into the slabline.

Figure 6A:
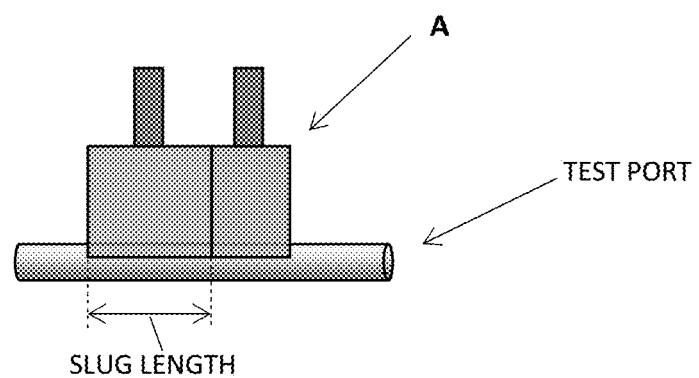
Figure 6B:
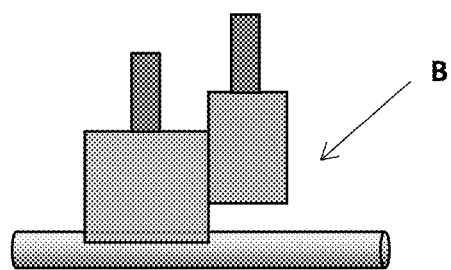
Figure 6C:
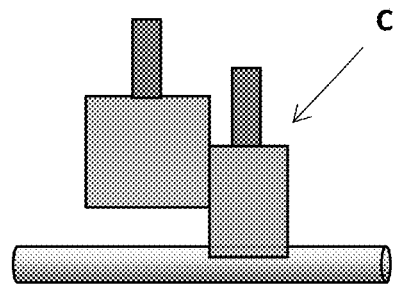

FIGS. 6A through 6C depict the three possible settings of the two-slug combination tuning probe: FIG. 6A depicts the combined very low frequency setting A; FIG. 6B depicts the low frequency setting B; FIG. 6C depicts the high frequency setting C.

Figure 7A:
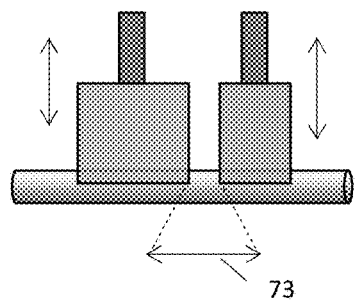
Figure 7B:
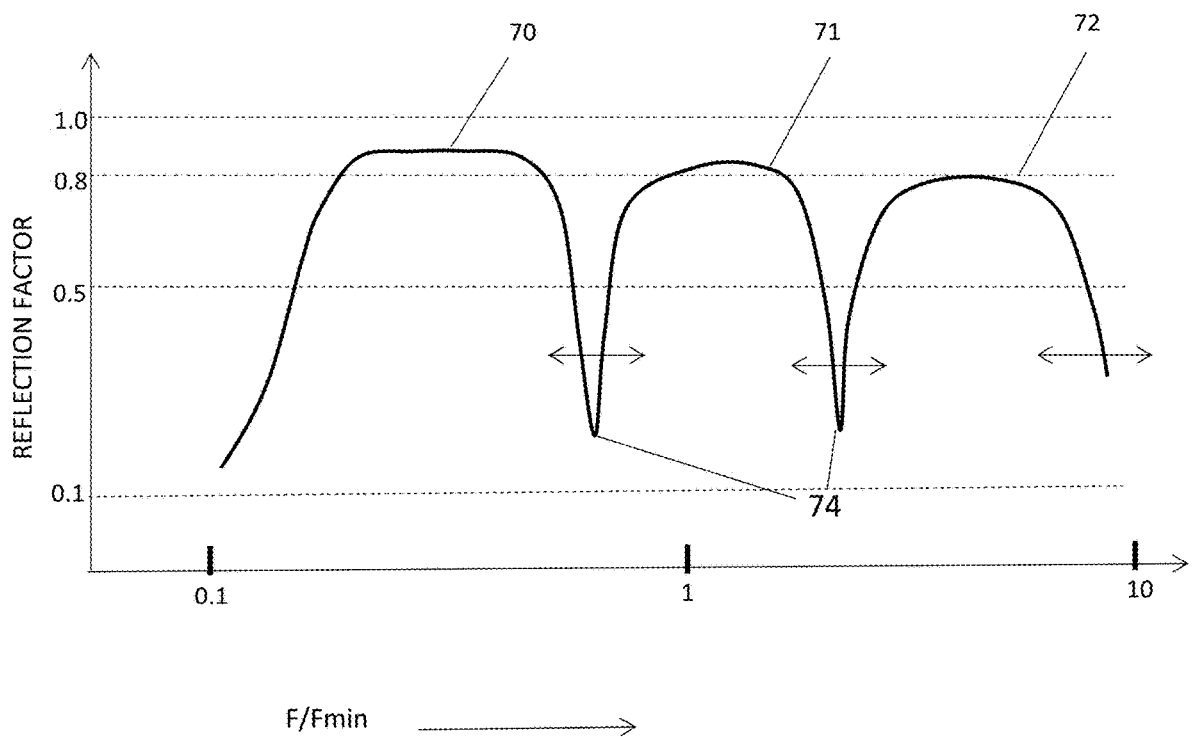

FIGS. 7A through 7B depict alternative setting of the combination tuning probe, whereby the two slugs have equal or different length: FIG. 7A depicts a setting of the slugs and the gap between them; FIG. 7B depicts the frequency response when both slugs are equally engaged.

Figure 8:
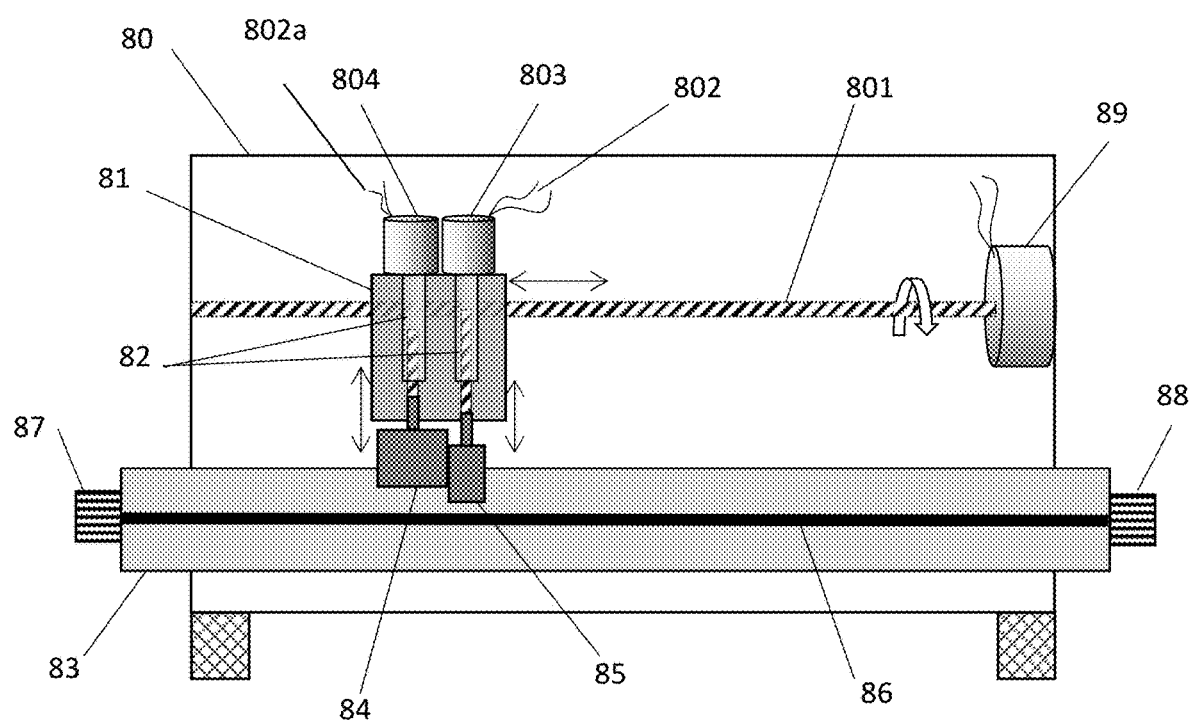

FIG. 8 depicts overall front view of slide screw impedance tuner using combination tuning probe.

Figure 9A:
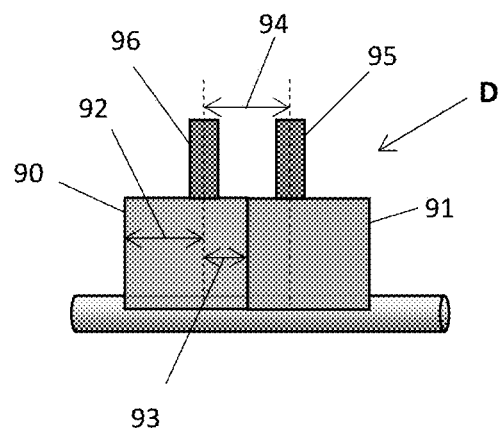
Figure 9B:
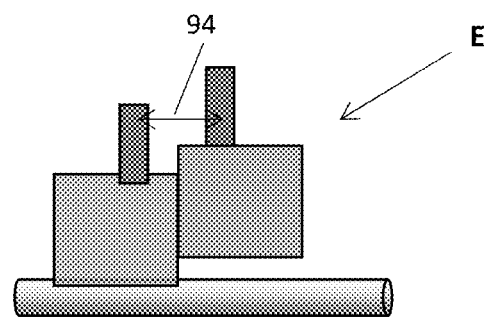
Figure 9C:
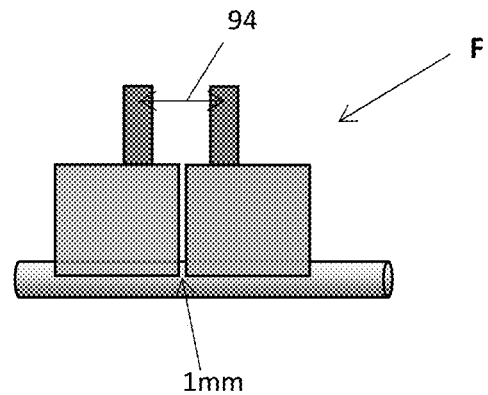

FIGS. 9A through 9C depict alternative settings of the combination probe, whereby the two slugs have equal length: FIG. 9A depicts the setting D where both slugs are equally engaged; FIG. 9B depicts the setting E where the slugs are differently engaged and FIG. 9C depicts the setting F where both slugs are engaged but there is a gap of 1 mm between them.

FIGS. 10A through 10B depict measured maximum reflection factor generated by a combination tuning probe including two slugs of equal length as shown in FIGS. 9A-9C: FIG. 10A depicts both slugs engaged touching (mode D) versus a single slug (mode E); FIG. 10B depicts both slugs engaged with a 1 mm gap between them (mode F) versus a single slug (mode E).

Figure 11:
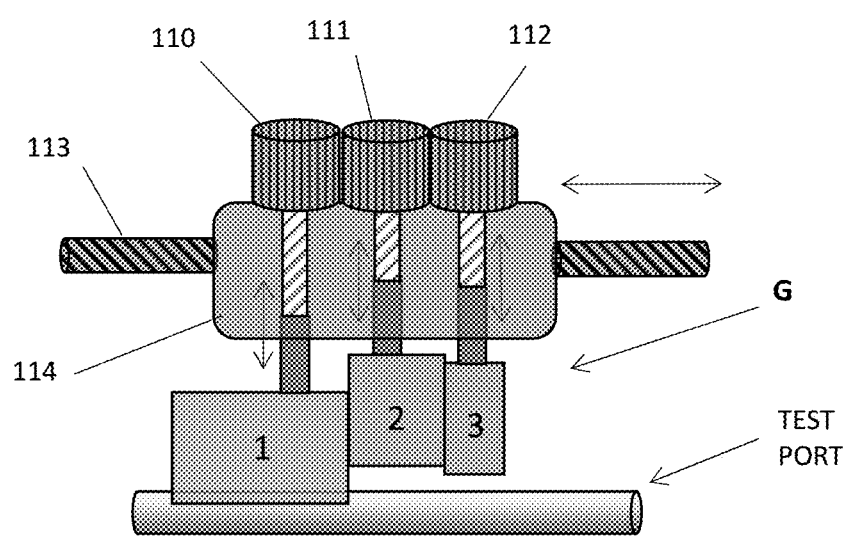

FIG. 11 depicts the concept of the combination tuning probe including three slugs, independently moving vertically and jointly moving horizontally.

DETAILED DESCRIPTION OF THE INVENTION

Figure 1:
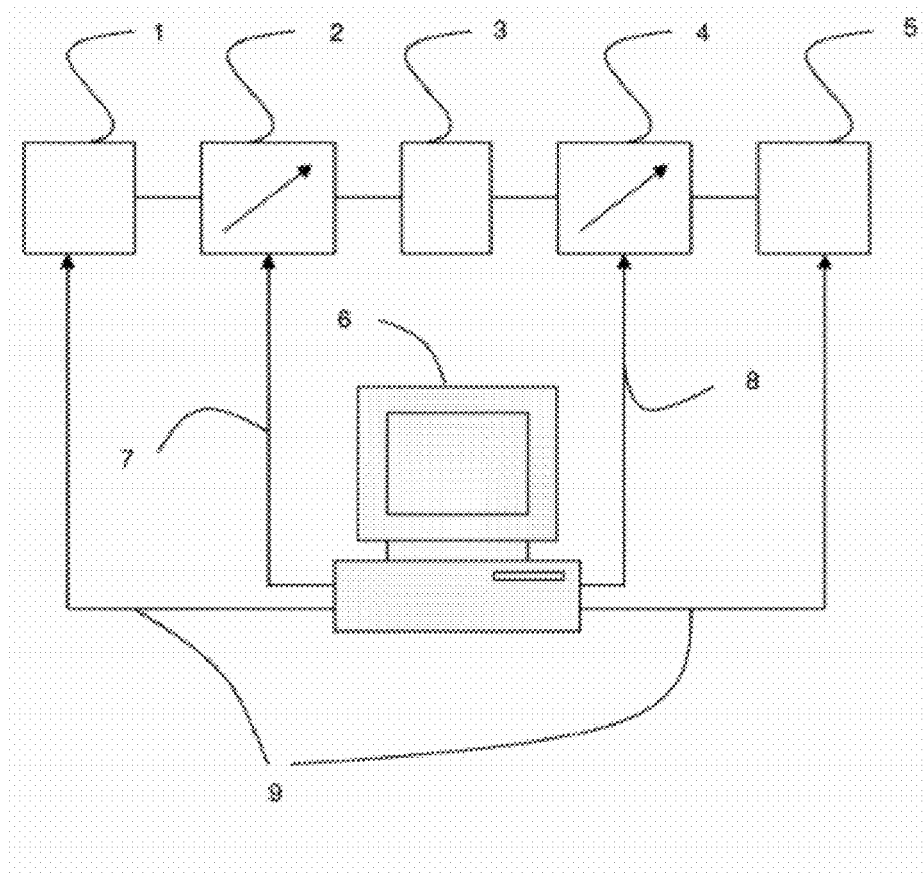
FIG. 1 depicts prior art, a typical scalar (measuring amplitude only) load pull test system using pre-calibrated passive tuners.
Figure 2:
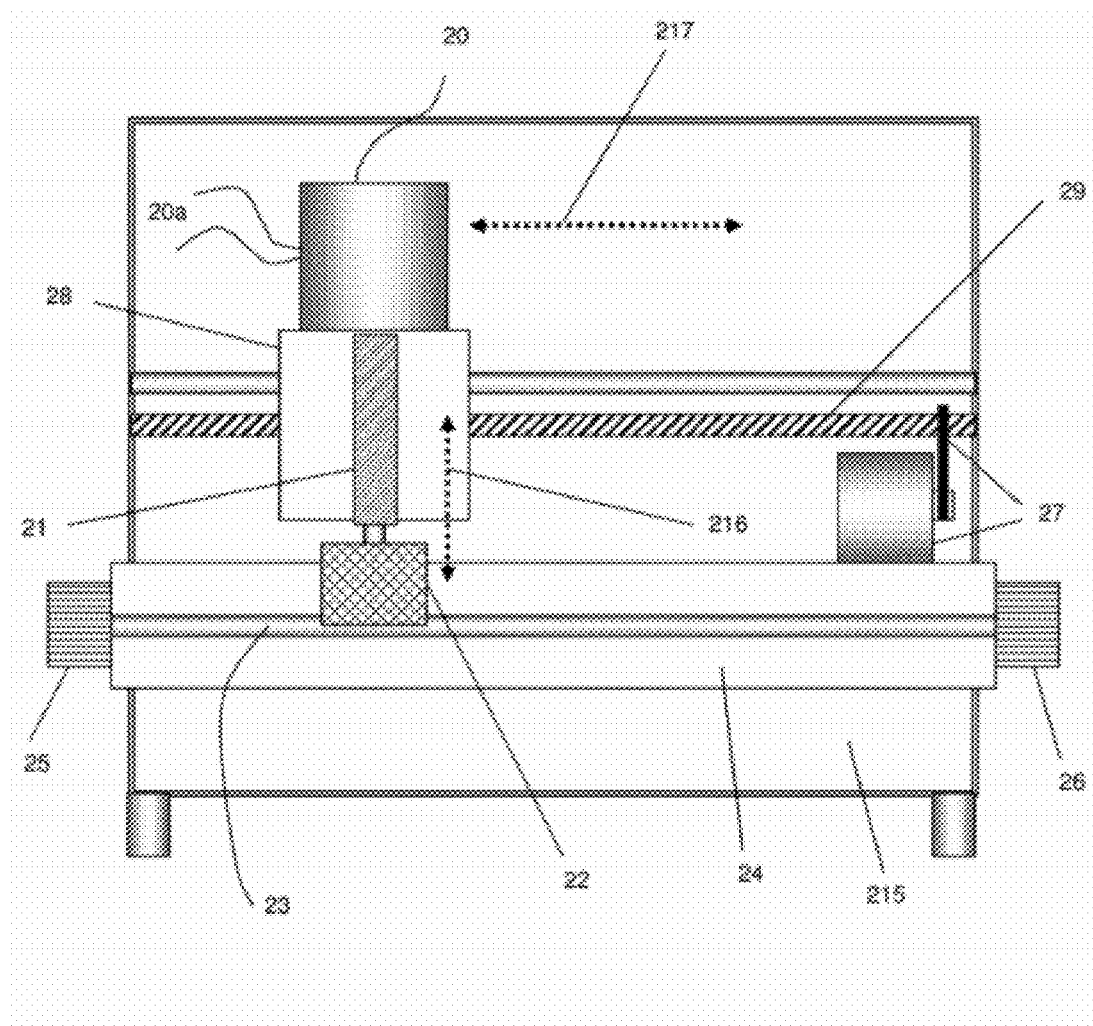
FIG. 2 depicts prior art, a schematic front view of a passive slide screw load pull tuner.

A typical slide screw tuner is shown in FIG. 2: it includes a slabline 24 with a center conductor 23, a test port 25 and an idle port 26. Inside the tuner housing 215 there is a mobile carriage 28 traveling along 217 the slabline driven by a screw 29 and a motor and gear 27; in the carriage 28, there is a vertical axis 21 moving towards and away 216 from the slabline and holding a capacitively coupled tuning probe (slug) 22. The vertical axis 21 and the slug 22 are controlled by a second motor 20 which is also remotely controlled 20a.

Figure 3:
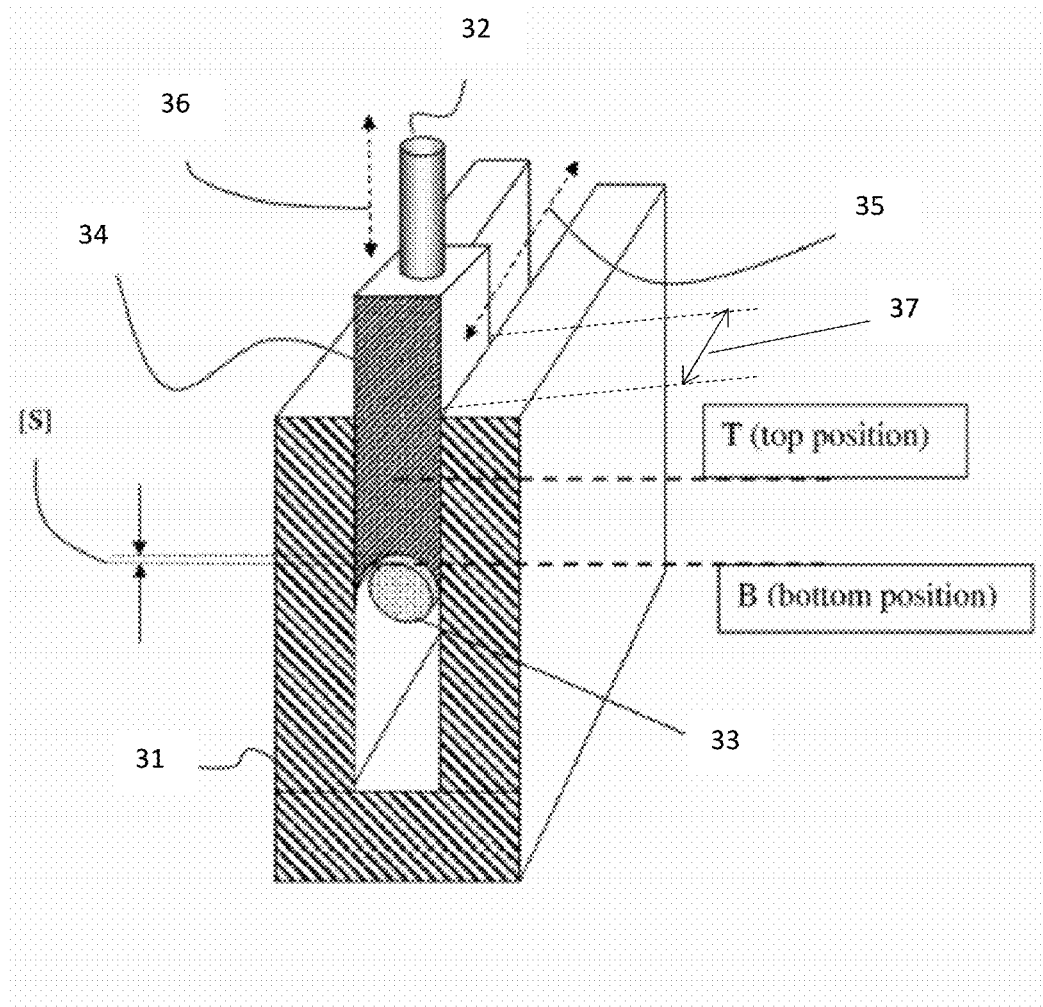
FIG. 3 depicts prior art, a perspective view of a metallic reflective tuning probe (slug).

The tuning slug is shown in FIG. 3: it includes a body 34 and has a concave bottom matching the diameter of the center conductor 33 of the slabline 31 and a holding pin 32 to be attached to the vertical axis 21. The slug moves vertically 36 and horizontally 35 controlled by the axis 21 and the carriage 28. Vertically it moves between a top position T and a bottom position B leaving a small gap [S] to avoid a short circuit. The length 37 of the parallelepiped slug is defined along the axis of the slabline.

Figure 4:
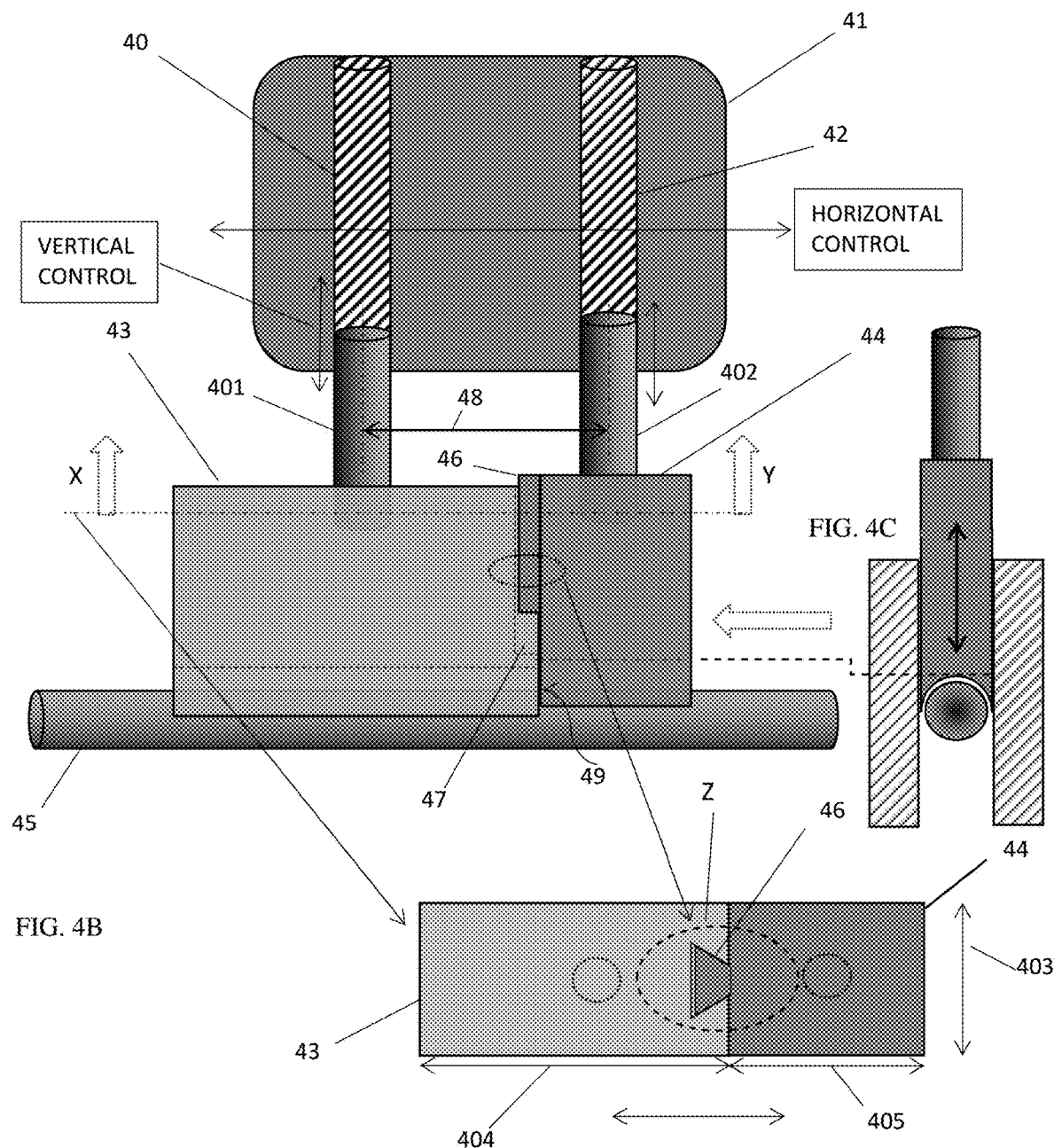
FIGS. 4A to 4C depict the combination tuning probe and control.
Figure 5:
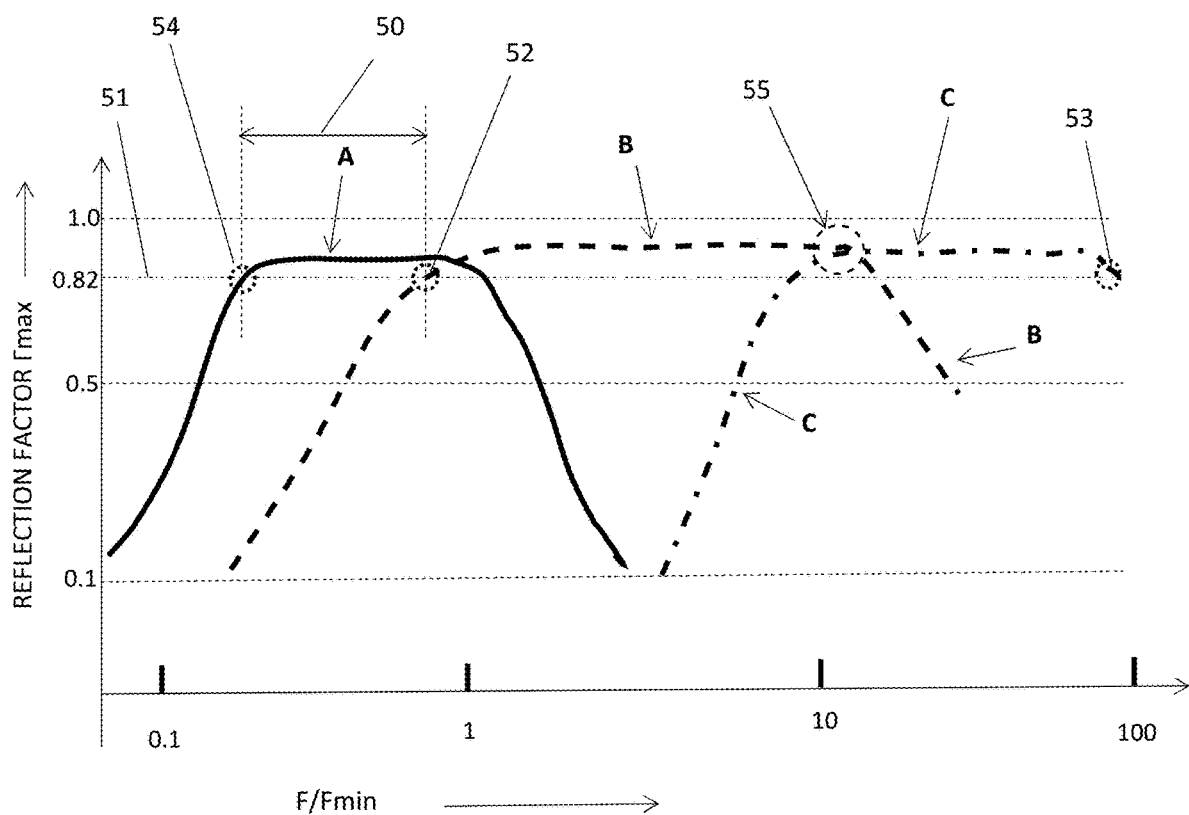
FIG. 5 depicts schematically the typical maximum reflection factor of the possible engagement combinations of two, different in length, slugs as a function of frequency.

FIG. 4A shows a dual-slug combination tuning probe: it includes two tuning slugs 43 and 44 having the same thickness 403 and equal or different lengths 404, 405; they are attached to each-other, using a protrusion 46 riding into a groove 47, and move vertically sliding avoiding intermittent RF contact 49, i.e., either making continuous contact or no contact at all very close to each-other during the vertical travel; the groove 47 extends as far as needed for the slugs to reach individually or together the minimum distance [S] to the center conductor 45 (FIG. 3). The slugs are held by vertical anchoring dowel pins 401 and 402 attached to the independent vertical screws (axes) 40 and 42, which are embedded into the mobile carriage 41 at the appropriate distance 48. The cross-section X-Y shows, in FIG. 4B, the slugs and the guiding groove 47 in detail Z. The view 4C shows the profile of the slugs and the projected limit of the concave bottom. A base of this invention is the fact that, due to the capacitive coupling between the slugs and the center conductor, the surface between the two bodies in combination with the wavelength of the operation frequency determine both the maximum reflection factor and the frequency band covered by the tuning probe (FIG. 5). The longer the slugs, the larger the surface, yielding on one hand higher capacitance and lower minimum frequency, but at the same time reduced maximum frequency, due to quarter-wavelength resonance of the low impedance transmission line section created between the slug and the center conductor (FIG. 7B). We therefore have the phenomenon where the length of each slug increases the ratio Fmax/Fmin by decreasing Fmin but also limits the bandwidth Fmax–Fmin by decreasing Fmax; in short, the minimum and maximum frequencies are proportional to the inverse of the length of each slug. Since the insertion loss in the slabline increases with frequency and reduces the effective reflection factor at the DUT, the best configuration, for minimizing the length between the test port and the tuning slugs and therefore the insertion loss, is to place the shortest (high frequency) slug closest to the test port and the DUT.

FIG. 5 shows schematically the frequency reflection factor Γmax response of the slugs and the various settings of the combination probe in order to define frequency bands and overlapping. When the short slug is inserted into the slot of the slabline at maximum proximity to the center conductor, as shown in FIG. 6C, the reflection factor follows the trace C, i.e., it starts at medium to high frequencies 55 and reaches flat up to very high frequencies 53; below a certain frequency 55 there is no useful reflection or impedance control. When the long slug is inserted, and the short slug extracted, as shown in FIG. 6B, the maximum reflection factor follows trace B, i.e., it starts at even lower frequencies 52 than before and slumps at medium high frequencies 55. When both slugs are, together, inserted into the slot of the slabline to maximum depth, as shown in FIG. 6A, then the reflection factor extends to low frequencies beyond the lowest frequency 52 of the long slug following trace A down to the lowest frequency 54. All this is normal capacitance behavior, since the longer the single or combined slug, the bigger the surface between center conductor and slug and the lower the impedance real(Z)=1/(ωC), where ω=2πF and C=$\varepsilon_0$*A/s, with C the capacitance, F the frequency, $\varepsilon_0$ the dielectric constant in air, A the area between slug and center conductor and s the actual gap s≥[S], (FIG. 3). The increase in frequency band of the combination tuning probe is visible as item 50, i.e., the extension of the frequency range by using the attached two slugs to create a longer slug. As can be seen in FIG. 5, the frequency bands of the various slugs can, but do not have to, overlap. For maximum continuous frequency coverage, the lengths of the slugs shall be chosen to overlap slightly (areas 52 and 55). But if coverage continuity is not a requirement, the lengths of the slugs can be chosen independently to either increase the maximum frequency (shorter slugs) or decrease the lowest frequency (longer slugs). In this case the frequency bands may not overlap.

The concept of the combination tuning probe using two slugs is expandable to three slugs. This is shown in FIG. 11: the three slugs 1, 2 and 3 are mounted in the same carriage 114 and are controlled individually vertically by motors 110, 111 and 112 and horizontally by the screw 113 and another (not shown) motor. Otherwise, the same conditions and limitations prevail with the configuration G, as with the alternative configurations A to F of two slugs and, combining the lengths of the three slugs further enhances the low end of the frequency range covered.

The maximum reflection Γmax generated by a tuning probe as a function of frequency defines the frequency band covered by the probe, as shown in FIG. 5: typical probe responses increase with frequency, remain nearly stable over a frequency range and decrease afterwards. They look typically like traces A, B, C in FIG. 5. Using a convention for Γmax we define the bandwidth. A typical convention is VSWR (Voltage Standing Wave Ratio)=10:1. This corresponds to Γmax=(VSWR−1)/(VSWR+1)≈0.82 as shown by the horizontal line 51. In view of this, the traces A, B and B, C are chosen to overlap at certain frequencies 52 and 55. Traces A and C though, do not overlap. If the two slugs 43 and 44 were not operable in unison, the specific tuner would cover the frequency band in the range from 52 to 53. By using the combination tuning probe and adding segment A, when the two slugs are used as a single longer slug, the covered frequency range and the maximum covered band extends from point 54 to 53, yielding a net gain marked by item 50 (see also measured results in FIG. 10A to 10B). This extends the frequency coverage from two decades to almost three decades, without any redesign of the tuner, by just adapting the anchoring and part of the design of the tuning slugs to the geometry of the carriage (i.e., the distance between the vertical axes). Since the frequency band covered by each slug depends directly of its horizontal length 37, it is obvious that by choosing the length one can adjust the frequency coverage. Such coverage can be chosen to either be identical, when the slugs have equal length (FIGS. 9A to 9C and 10A to 10B) or different, when the slugs have different lengths (FIGS. 4A and 6A to 6C); in this last case the lengths can be chosen such that the frequency bands partly overlap (FIG. 5) or do not overlap. Hereby overlapping is defined when there is a non-zero band of frequencies, where both slugs can create at least the reflection factor required (typically 0.82).

An important condition for appropriate operation of the combination tuning probe is controlling the gaps 73 between the slugs as they move together down especially close to the center conductor. As long as a single slug approaches the center conductor, any gaps are irrelevant. But when two or more slugs operate as a single long slug, gaps will create signal leaks, which, depending on the size of the gap 73, will manifest as holes 74 or 100, 102, 103 (FIG. 10) in the continuous reflection factor response of the tuning probe. The position and depth of the fractures between the reflection factor traces 70, 71, 72 depend on the size of the gap 73 and the actual frequency covered by the individual slugs. FIGS. 10A and 10B show typical experimental results, measured using a set of two identical slugs 90 and 91 forming a combination tuning probe. As can be seen from FIG. 10A the increase of frequency bandwidth towards the lowest frequency covered between a single slug (mode E) and the two joint slugs (with the gap 73 equal zero, mode D) moves from Fmin1=300 MHz to Fmin2=120 MHz, an increase |Fmin2−Fmin1|/Fmin1=180/300=60%. The corresponding increase in bandwidth, when there is an approximate gap 73 of 1 mm between the two slugs can be observed in FIG. 10B and is 150 MHz or 50%, as defined before (mode F). On the other hand, the hole 100 in the case of the joint slugs moves slightly from 1.4 GHz to 1.35 GHz, point 101, in the case of the 1 mm gap. This shift occurs in the frequency area covered by the single slug which extends beyond 3 GHz, and is therefore irrelevant.

The load pull tuner using at least one combination tuning probe, is shown in FIG. 8. As a prior art tuner (FIG. 2) it includes a solid housing 80, a slabline 83 with a center conductor 86, a test 87 and an idle 88 port, a mobile combo carriage 81 holding two vertical axes 82 controlling the two slugs 84 and 85 via the remotely 802, 802a controlled stepper motors 803 and 804. The carriage is moved along the slabline 83 using an ACME screw 801 or other gear controlled by stepper motor 89. The slugs 84 and 85 can move up and down individually or in unison, all controlled by external software via an electronic interface controlling the motors.

The horizontal distance 94 (FIG. 9A) corresponding to the distance between the two axes 82 or the holding pins 95 and 96 of the two slugs 90 and 91 is given by the overall design of the mobile carriage, the vertical motor size etc. To create a universal design, in which changing the size of the slugs, in order to cover different frequency bands, does not require re-designing the carriage or discarding the whole tuner, the slugs may have to be anchored to the vertical axes off center i.e., the lengths 92 and 93 to be different, as shown in FIG. 9A, where the length of the slugs 90 and 91 are chosen to be approximately equal in configurations D and E and would not fit sliding on each other, given the fixed distance 94 between the vertical axes, defined by the design of the mobile carriage; the same is valid for configuration F, even though a small non-zero gap should not be a typical design objective because it excludes the guiding mechanism Z (46, 47) and, if any, it would rather have a deteriorating effect on the reflection factor response (FIG. 10B).

The present invention discloses a combination tuning probe for load pull tuners, having and operating two or three vertically independently movable slugs, whereby allowing decreasing the lowest frequency of operation of the tuner. The slugs are mounted and controlled such as to create a longer and lower frequency slug as either individual slug. Obvious alternatives shall not impede on the originality of the idea.

What is claimed is:

1. A method for creating combination tuning probes for slide screw impedance tuners comprising a probe interlacing mechanism,
   wherein
      the slide screw impedance tuners comprise a slabline with a center conductor, a test and an idle port, and at least one remotely controlled mobile carriage sliding horizontally along the slabline and having at least two remotely controlled vertical control mechanisms (axes), holding tuning probes (slugs), a first axis holding a first slug and a second axis holding a second slug,
   and wherein
      the tuning slugs are parallelepiped metallic devices, each having a front- a back- and two side-walls, and a concave bottom matching a contour of the center conductor, and are inserted adjacent to each-other, side-wall by side-wall, in the slabline,
   and wherein
      the probe interlacing mechanism comprises a vertical guide along a side-wall of either slug,
   wherein
      the guide of the first slug forms an inverse prismatic ridge which is captured by and slide fits into the guide of the second slug, which forms an inverse prismatic rut, allowing the slugs to interlace and slide vertically independently while touching each-other.

2. The method for creating combination tuning probes for slide screw impedance tuners of claim 1,
   wherein
      the slugs slide touch each-other sidewise uninterruptedly over their entire range of horizontal and vertical movement inside the slabline.

3. The method for creating combination tuning probes for slide screw impedance tuners of claim 1,
   wherein
      the slugs have the same horizontal length.

4. The method for creating combination tuning probes for slide screw impedance tuners of claim 1, further including a third slug, wherein at least one slug has vertical guides on both side-walls.

5. The method for creating combination tuning probes for slide screw impedance tuners of claim 1,
wherein
the slugs have different horizontal length, one slug being shorter than the other.

6. The method for creating combination tuning probes for slide screw impedance tuners of claim 5,
wherein
the shorter slug, covering a high frequency band, is placed closest to the test port of the slabline.

\* \* \* \* \*